United States Patent

Oishi

Patent Number: 5,981,392
Date of Patent: Nov. 9, 1999

[54] METHOD OF MANUFACTURING SEMICONDUCTOR MONOCRYSTALLINE MIRROR-SURFACE WAFERS WHICH INCLUDES A GAS PHASE ETCHING PROCESS, AND SEMICONDUCTOR MONOCRYSTALLINE MIRROR-SURFACE WAFERS MANUFACTURED BY THE METHOD

[75] Inventor: Hiroshi Oishi, Annaka, Japan

[73] Assignee: Shin-Etsu Handotai Co., Ltd., Tokyo, Japan

[21] Appl. No.: 08/824,176

[22] Filed: Mar. 26, 1997

[30] Foreign Application Priority Data

Mar. 28, 1996 [JP] Japan ................... 8-099047

[51] Int. Cl.⁶ ............................... H01L 21/306
[52] U.S. Cl. .................. 438/691; 438/692; 438/706; 438/974
[58] Field of Search ................. 438/719, 460, 438/706, 691, 692, 693, 715, 974; 216/52, 58, 79

[56] References Cited

U.S. PATENT DOCUMENTS

| 5,516,706 | 5/1996 | Kusakabe | 438/476 |
| 5,744,401 | 4/1998 | Shirai et al. | 438/693 |

FOREIGN PATENT DOCUMENTS

| 319805 | 6/1989 | European Pat. Off. . |
| 588055 | 3/1994 | European Pat. Off. . |
| 617457 | 9/1994 | European Pat. Off. . |
| 4108394 | 9/1992 | Germany . |

OTHER PUBLICATIONS

Takao Abe, et al., "Microroughness Measurements on Polished Silicon Wafers", 362 Japanese Journal of Applied Physics, Part 1, 31 (1992) Mar., No. 3, Tokyo, JP.

Toshiro Nakanishi, et al., "Influence of Silicon Surface Roughness on Time–Dependent Dielectric Breakdown", 2311 Fujitsu Scientific & Technical Journal 29 (1993) Summer, No. 2, Kawasaki, JP.

*Primary Examiner*—Robert Kunemund
*Assistant Examiner*—Donald L. Champagne
*Attorney, Agent, or Firm*—Loeb & Loeb, LLP

[57] ABSTRACT

A method of manufacturing a semiconductor monocrystalline mirror-surface wafer includes at least a gas phase etching process and a mirror-surface polishing process. The mirror-surface polishing process is composed of coarse polishing and finishing polishing, and only the coarse polishing is performed prior to the gas phase etching process, while the finishing polishing is carried out after the gas phase etching process. In addition, a heat treatment process is performed after the gas phase etching process but before the final cleaning process. The heat treatment process also serves as a donor-annihilation heat treatment process. The method can manufacture semiconductor monocrystalline mirror-surface wafers having a high degree of flatness, while resolving the problems involved in the conventional method; i.e., haze produced on a wafer surface, the introduction of strain and defects in the surface, high cost, and low productivity.

10 Claims, 6 Drawing Sheets

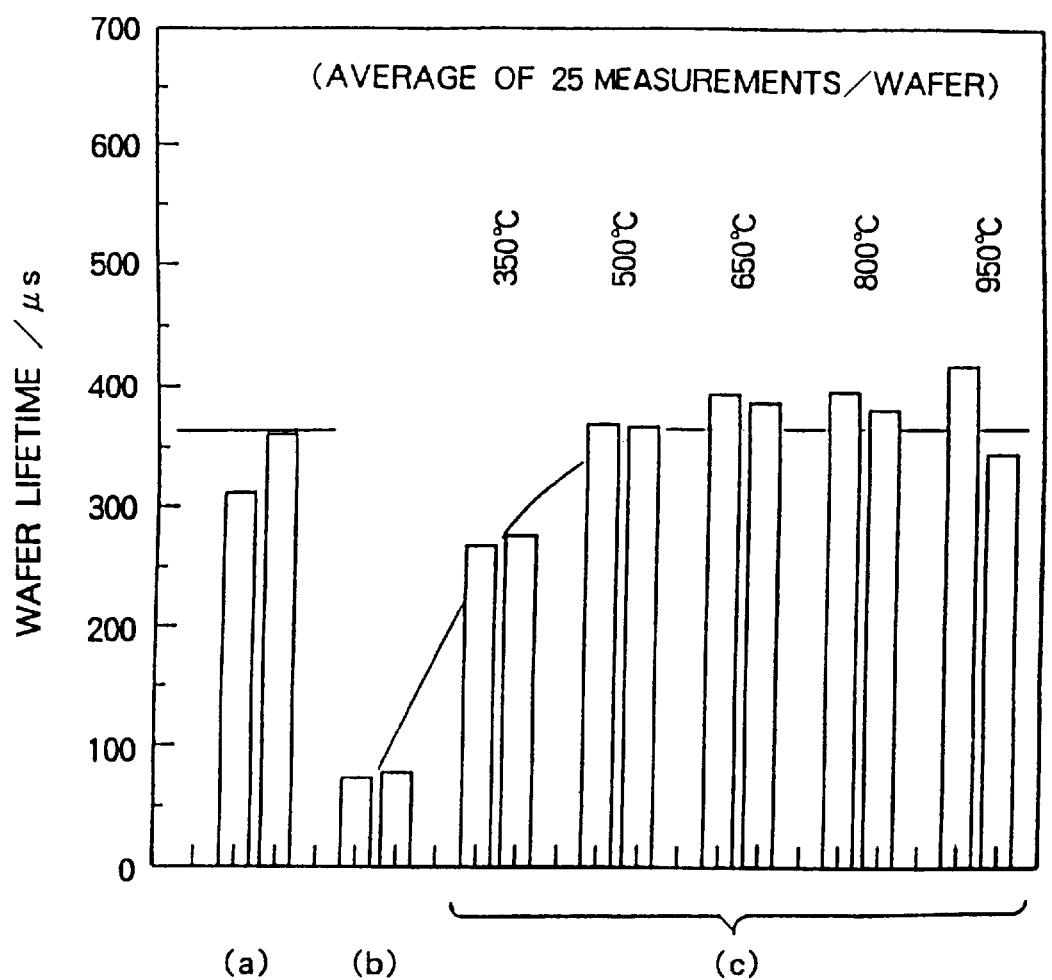

METHOD OF MANUFACTURING SEMICONDUCTOR MONOCRYSTALLINE MIRROR-SURFACE WAFERS WHICH INCLUDES A GAS PHASE ETCHING PROCESS, AND SEMICONDUCTOR MONOCRYSTALLINE MIRROR-SURFACE WAFERS MANUFACTURED BY THE METHOD

BACKGROUND OF THE INVENTION

1. Field of the Invention

The present invention relates to a method of manufacturing semiconductor monocrystalline mirror-surface wafers having a high degree of flatness which method includes a gas phase etching process, and more particularly to a method of manufacturing semiconductor silicon mirror-surface wafers, and to semiconductor monocrystalline mirror-surface wafers having a high degree of flatness manufactured by this method.

2. Description of the Related Art

As shown by the process flow chart in FIG. 6, a conventional method of manufacturing semiconductor silicon mirror-surface wafers has generally comprised a slicing process A in which a monocrystalline ingot produced with a monocrystalline production apparatus is sliced so as to obtain thin disk-like wafers; a chamfering process B in which the peripheral edges are chamfered so as to prevent generation of cracks and defects in the wafer obtained in the process A; a lapping process C in which the chamfered wafer is lapped so as to have a flat surface; an etching process D in which the working damage remaining in the chamfered and lapped wafer surface is eliminated; a primary mirror-surface polishing process E in which the surface of the etched wafer is coarsely polished, a finishing mirror-surface polishing process F in which the surface of the wafer which has been subjected to the primary mirror-surface polishing is subjected to finishing mirror-surface polishing; and a final cleaning process G in which the wafer which has been subjected to finishing mirror-surface polishing is cleaned so that the polishing material and foreign matter attached to the wafer is removed.

In some cases, the mirror-surface polishing process involves three stages of polishing; namely a primary polishing, a secondary polishing, and a finishing polishing, or even more stages, so as to provide good flatness and surface roughness.

Furthermore, in those cases where wafers are produced from an ingot of semiconductor silicon manufactured according to the Czochralski method, a donor-annihilation heat treatment for eliminating the effect of resident oxygen donors is generally carried out before the mirror-surface polishing process; for example, immediately after the etching process D.

However, the above-described conventional method of manufacturing semiconductor mirror-surface wafers involves many processes and is complicated; moreover, even though the production cost is therefore high, the conventional method is still unable to provide the exacting degree of flatness demanded by the higher degrees of integration of recent leading semiconductor devices.

Thus, research and development of various techniques has continued, with a view of increasing the degree of integration of future semiconductor devices and increasing the diameter and improving the flatness of wafers.

Among them, a particularly important technique known as PACE (plasma assisted chemical etching) has been developed recently (for example, see Japanese Patent Application Laid-Open (kokai) Nos. 5-160074, 6-5571, and 7-288249).

In this method, the thickness of a wafer is made uniform through gas phase etching. The amount of material removed by plasma etching is controlled through measuring the thickness distribution of the wafer and then controlling the speed of the nozzle which scans over the wafer in accordance with the thus measured distribution. By this means, the wafer thickness is rendered uniform and the wafer is rendered very flat.

If the PACE process is inserted after the finishing mirror-surface polishing process F of the conventional method of manufacturing semiconductor monocrystalline silicon mirror-surface wafers shown in FIG. 6, the degree of flatness of the wafer (TTV, total thickness variation; i.e., the difference between the maximum thickness and the minimum thickness over the entire surface of a wafer), can be markedly improved (see FIG. 5B) as compared with the case of the conventional method (see FIG. 5A). Hence, a satisfactorily high degree of flatness required for future semiconductor mirror-surface wafers can be obtained through this method.

However, although the aforementioned PACE technique greatly improves wafer flatness, a new roughness with a periodicity of about 0.01–5 $\mu$m, known as haze, is inevitably produced on the surface since the wafer is exposed to high energy plasma, and the surface roughness which has been improved by the finishing mirror-surface polishing is inevitably affected adversely. Thus, in order for this haze to be removed, a special polishing known as "touch polishing" must be performed so as to remove the material in a thickness of about 10 nm.

Furthermore, PACE is liable to introduce damage and defects in the wafer surface, and a further process such as a polishing, etching, or heat treatment must be performed in order to remove such damage and defects after the PACE treatment.

SUMMARY OF THE INVENTION

An object of the present invention is to provide a method of manufacturing semiconductor monocrystalline mirror-surface wafers having a high degree of flatness, which method can resolve the problems involved in the conventional method including a gas phase etching process such as PACE; i.e., haze produced on a wafer surface, the introduction of damage and defects in the surface, high cost, and low productivity.

Another object of the present invention is to provide semiconductor monocrystalline mirror-surface wafers manufactured by the above method.

In order to achieve the above objects, the present invention provides a method of manufacturing semiconductor monocrystalline mirror-surface wafers comprising at least a slicing process in which a semiconductor monocrystalline ingot is sliced to obtain a thin disk-shaped wafer; a chamfering process in which the peripheral edge of the wafer obtained in the slicing process is chamfered; a lapping process in which the chamfered wafer is lapped so as to have a flat surface; an etching process in which working damage remaining in the chamfered and lapped wafer surface is removed; a mirror-surface polishing process in which the surface of the etched wafer is subjected to mirror-surface polishing; a gas phase etching process in which the surface of the mirror-surface polished wafer is flattened to a high degree; and a final cleaning process in which the wafer which has been mirror-surface polished and flattened to a high degree is cleaned. The mirror-surface polishing process preceding the aforementioned gas phase etching process is stopped after coarse polishing, and the finishing polishing is carried out after the gas phase etching process.

The mirror-surface polishing process preceding the gas phase etching is stopped at the coarse polishing stage as described above because if the wafer is subjected to gas phase etching after the finishing mirror-surface polishing as was done in the past, the aforementioned haze is inevitably introduced by the gas phase etching process, and the surface roughness which has been improved by the finishing mirror-surface polishing is inevitably affected adversely. Thus, stopping at the coarse polishing stage in the mirror-surface polishing process before carrying out the gas phase etching makes it possible to avoid a wasteful process by carrying out the finishing mirror-surface polishing after the gas phase etching process, and also makes it possible to obtain wafers which have excellent flatness provided by the gas phase etching, especially PACE, and excellent surface roughness provided by the finishing mirror-surface polishing.

Preferably, the coarse polishing in the aforementioned mirror-surface polishing process preceding the gas phase etching process is carried out in such a way that the RMS value of the ripple component is not more than 0.5 nm.

The aforementioned coarse polishing in the mirror-surface polishing process preceding the gas phase etching process is carried out in such a way that the RMS value of the roughness component having a periodicity of about 5–100 μm, which is known as ripple, is limited to not more than the specified value so as to reduce as much as possible the removal of the material in the finishing polishing process which is carried out after the gas phase etching process, thereby reducing adverse effect on the high degree of flatness produced by the gas phase etching, especially by PACE.

In this case, a heat treatment process is preferably carried out after the aforementioned gas phase etching process and before the aforementioned final cleaning process.

The surface damage and defects introduced by the gas phase etching, especially PACE, can be eliminated by carrying out a heat treatment after the gas phase etching process in this way.

In this case, the heat treatment process is preferably carried out before the finishing mirror-surface polishing process.

If heat treatment is carried out after the gas phase etching process and before the finishing mirror-surface polishing process, any oxide film, contamination, etc. which may be formed on the wafer surface as a result of the heat treatment can be eliminated.

The aforementioned heat treatment process is preferably carried out for 20 minutes to 2 hours at a temperature in the range of 400–800° C.

Subjecting the wafer to heat treatment after gas phase etching under such conditions makes it possible to completely eliminate the surface damage and defects of the wafer which have been introduced in the gas phase etching—especially by the PACE process—as well as to overcome wastage due to the treatment temperatures and treatment times above the required levels.

The heat treatment is preferably a donor-annihilation heat treatment.

The donor-annihilation heat treatment which is conventionally carried out before the mirror-surface polishing process, for example, after the etching process, is carried out after the gas phase etching process, so that the donor-annihilation heat treatment may also serve as a heat treatment for removing the surface damage and defects produced by the gas phase etching process. This makes it possible to resolve the problems of gas phase etching, especially PACE, without introducing any increase in cost.

The semiconductor monocrystal is preferably silicon.

Since the method of the present invention can be used to obtain a semiconductor monocrystalline mirror-surface wafer having a high degree of flatness, it will be of particular advantage in the manufacture of future silicon semiconductor monocrystalline mirror-surface wafers which will require a high degree of flatness for an increased degree of integration.

Thus, the present invention is effective when, as the gas phase etching, especially plasma assisted chemical etching is carried out.

Thus, the semiconductor monocrystalline mirror-surface wafers manufactured by the method of the present invention have a high degree of flatness; thus they adequately satisfy the high degree of flatness required for leading wafers which will be in demand in the future.

BRIEF DESCRIPTION OF THE DRAWINGS

FIG. 4 is a drawing which shows the effect of presence or absence of a heat treatment and treatment temperature in the present invention and the conventional process;

FIGS. 5A and 5B are drawings which illustrate the flattening effect due to a PACE process on a silicon monocrystalline mirror-surface wafer having a diameter of 200 mm, wherein FIG. 5A shows the case of the conventional process and FIG. 5B shows the case where the PACE process has been included.

DESCRIPTION OF THE INVENTION AND EMBODIMENTS

Figure 1:
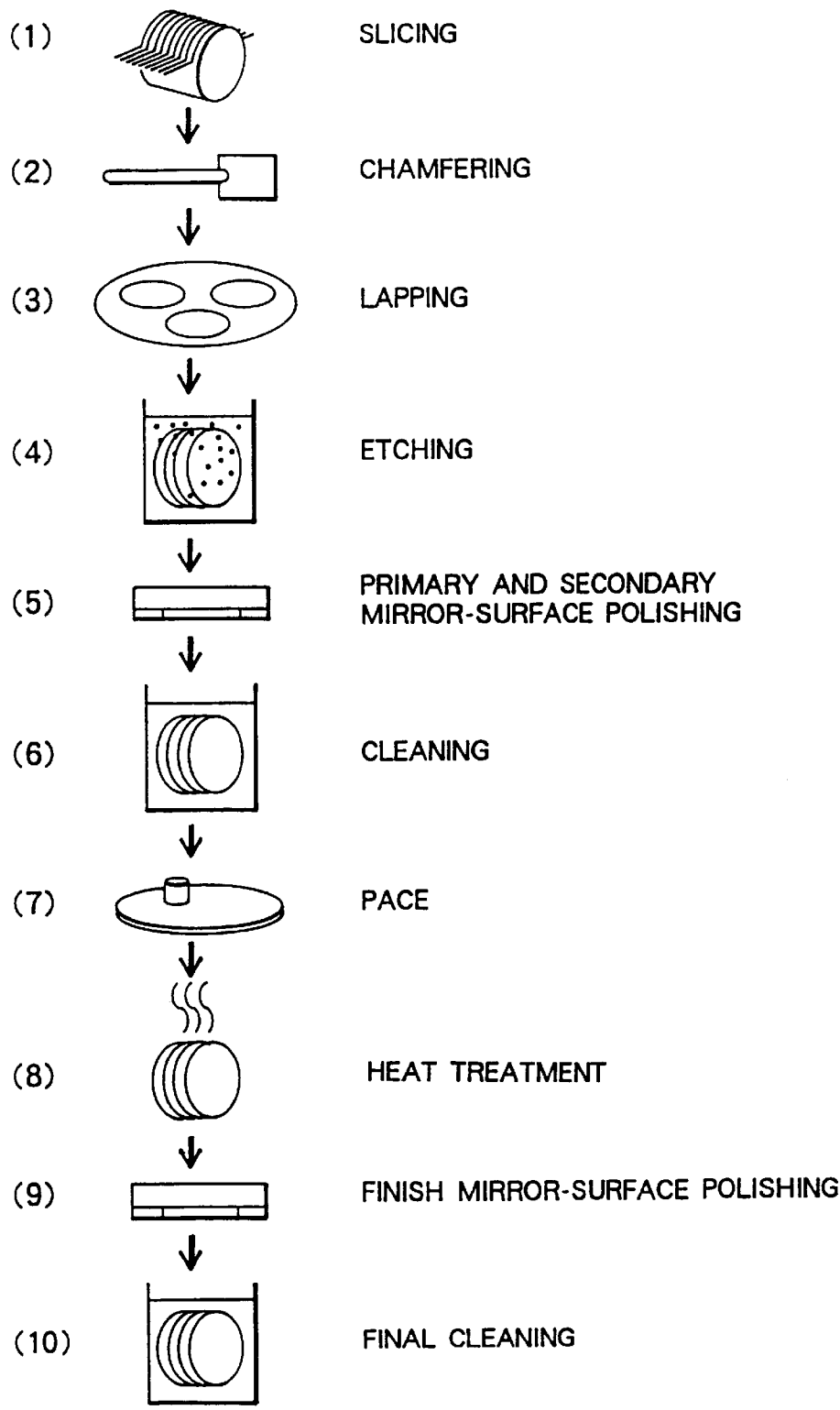
FIG. 1 is a general process flow chart of the method of manufacturing semiconductor monocrystalline mirror-surface wafers according to the present invention.

The present invention is described in more detail below.

In a process whereby very flat semiconductor monocrystalline mirror-surface wafers are manufactured using gas phase etching, especially the PACE process, it is generally necessary to reduce the cost as far as possible and to resolve problems such as haze and damage which are generated by the PACE process without losing the high degree of flatness provided by the PACE process. The PACE process serving as a gas phase etching method is described as an example.

As has been described above, the PACE process produces a new roughness with a periodicity of about 0.01–5μm, known as haze. Consequently, this must be eliminated by some sort of finishing mirror-surface repolishing subsequent to the PACE process. If this is done, it becomes unnecessary to use as the wafer used in the PACE process a wafer having good surface roughness obtained through conventional finishing mirror-surface polishing, and it can be said that just coarse polishing is satisfactory.

On the other hand, the productivity associated with PACE worsens in inverse proportion to the stock removal. Hence, in consideration of the wafer processing cost it is desirable that the stock removal to be removed by the PACE process be restricted to not more than a few $\mu$m. Thus, it is desirable that a wafer to be subjected to the PACE process have a certain degree of flatness and that its surface be not rough.

Furthermore, the stock removal removed by the conventional PACE process varies from a few $\mu$m to a few tens of $\mu$m and in such a case, the surface roughness of the wafer used remains virtually unchanged before and after the PACE process. That is, when a PACE process is carried out with, for example, a conventional etched wafer (a wafer subsequent to the etching process D of FIG. 6) which has not been subjected to mirror-surface polishing, there is a marked improvement in the degree of flatness of the wafer, but the surface roughness is the same as that of the etched surface prior to the PACE process.

Furthermore, if the PACE process is carried out with, for example, a wafer which has been mirror-surface polished, the aforementioned surface roughness component having a periodicity of 5–100 $\mu$m, known as ripple, is not eliminated and still remains. Hence, in order to remove the ripple, mirror-surface polishing must be carried out again subsequent to the PACE process.

However, it is very likely that the very high degree of flatness produced by the PACE process will inevitably be affected adversely at this time. Hence, repolishing after the PACE process must involve as little stock removal as possible.

In view of the above-described facts, in the present invention, the mirror-surface polishing process prior to the PACE process is stopped at the coarse polishing stage and the finishing polishing is carried out after the PACE process.

The mirror-surface polishing process prior to the PACE processing is stopped at the coarse polishing stage (here this signifies the polishing prior to the finishing polishing, such as primary polishing or secondary polishing) because if PACE is carried out using a wafer after the finishing polishing in the conventional way, the aforementioned haze is inevitably introduced in the PACE process and the surface roughness improved by the finishing mirror-surface polishing is inevitably affected adversely. Thus, a wasteful process can be avoided and a reduction in processing cost can be achieved by stopping the mirror-surface polishing process prior to the PACE process at the coarse polishing stage and carrying out the finishing mirror-surface polishing after the PACE process.

In this case, the coarse polishing in the mirror-surface polishing process prior to the PACE process is preferably carried out in such a way that the RMS value of the ripple component (expressed by root mean square roughness of the surface roughness having a periodicity of 5–100 $\mu$m) is not more than 0.5 nm.

In connection with the ripple, as previously mentioned, the roughness prior to the PACE process remains as it is after the PACE process. Hence, in order to reduce as far as possible the stock removal in the finishing polishing process carried out after the PACE process and to avoid worsening the high degree of flatness provided by the PACE processing, the ripple component must be removed as much as possible in the mirror-surface polishing process prior to PACE. This is the reason for carrying out coarse polishing so that the RMS value of the ripple component becomes not more than 0.5 nm.

Thus, in the present invention, the mirror-surface polishing process prior to the PACE process is stopped at the coarse polishing wherein only the reduction of the ripple component had been considered, and the finishing polishing is carried out after the PACE process.

For such a coarse polishing process, there should be carried out mirror-surface polishing with the omission of the so-called finishing polishing carried out in the conventional process. In those cases where the conventional process comprises three stages with a primary polish, a secondary polishing and a finishing polishing, or even more stages, the aforementioned coarse polishing process should be the mirror-surface polishing process where, in addition to the finishing polishing, part of the earlier polishing process is also omitted.

As described above, the excess ripple component and the haze component produced by the PACE process can be eliminated without increasing the stock removal removed by the finishing polishing carried out after the PACE process. Also, the high degree of flatness produced by the PACE process is not adversely affected. Furthermore, this process is simply a change of the order in which the conventional finishing polishing process is carried out and there is no need for the addition of a special process such as touch polishing, as mentioned earlier.

Thus, semiconductor monocrystalline mirror-surface wafers having both a good degree of flatness provided by the PACE process and good surface roughness provided by the finishing mirror-surface polishing can be manufactured at lower cost than with the conventional semiconductor monocrystalline mirror-surface wafer manufacturing process in which PACE is included.

In the method according to the present invention, a heat treatment is preferably performed after the PACE process and before the final cleaning process.

This is because the PACE process is liable to introduce damage and defects in the wafer surface, and the damage and defects must be removed by an additional process subsequent to the PACE process, such as polishing, etching, or heat treatment. This can also be achieved by the finishing mirror-surface polishing process subsequent to the PACE process as described above. However, since the stock removal removed in the finishing polishing is made as little as possible in order to maintain the high degree of flatness provided by the PACE process, surface damage and defects cannot be completely eliminated by the finishing polishing process in some cases.

By carrying out a further heat treatment after the PACE process in this way, the surface damage and defects introduced by the PACE process can be eliminated completely without adversely affecting the degree of flatness.

Thus, this heat treatment is preferably carried out after the PACE process and before the finishing mirror-surface polishing. This is because there is a possibility of formation of, for example, an oxide film or contamination on the wafer surface as a result of the heat treatment, but even in this event, it can be subsequently removed by the finishing mirror-surface polishing process.

The heat treatment for the elimination of the damage and defects in the wafer surface after the PACE process is preferably carried out at a temperature in the range of 400–800° C. for a period of 20 minutes to 2 hours.

A heat treatment temperature below 400° C. is insufficient for eliminating the damage and defects, and if the temperature exceeds 800° C. the wafer may be subject to various adverse effects, such as oxidation, and in any case at temperatures below 800° C. the damage elimination effect is satisfactory. Thus, for example, the damage can be eliminated completely with heat treatment for 1 hour at 500° C. without causing problems such as those indicated above. Moreover, a heat treatment time of 20 minutes to 2 hours is preferred. This is because the elimination of damage is inadequate with heat treatment for less than 20 minutes and satisfactory elimination of the damage can be accomplished if the heat treatment is carried out for 2 hours.

Here, in those cases where mirror-surface wafers are produced from an ingot of semiconductor silicon manufactured in accordance with the Czochralski method, a donor-annihilation heat treatment must be carried out in order to eliminate the effect of resident oxygen donors, and this is carried out for about 30 minutes at around 650° C., usually in a process prior to the mirror-surface polishing process, for example immediately after the etching process.

Thus, in the present invention, the donor-annihilation heat treatment can be carried out after the PACE process such that the donor-annihilation heat treatment serves as a heat treatment for the elimination of the surface damage and defects produced by the above-described PACE process. This makes it possible to eliminate the surface damage and defects which are a problem with PACE without giving rise to increased cost, by merely changing the position of the donor-annihilation heat treatment within the overall conventional process.

Embodiments of the present invention are described in detail below with reference to the drawings, but the invention is not limited to these embodiments.

FIG. 1 is a general flow chart of the method of manufacturing a semiconductor monocrystalline mirror-surface wafer according to the present invention.

As has been described in detail above, a marked increase in the production cost inevitably results if a PACE process, a heat treatment process to eliminate the residual damage, and a mirror-surface repolishing process for haze removal are simply added after a conventional mirror-surface polishing process which includes processes up to finishing mirror-surface polishing. Moreover, in such a case, there is also a risk that the high degree of flatness provided by the PACE process will be adversely affected.

An example of an optimum process for the method of manufacturing a semiconductor monocrystalline mirror-surface wafer in accordance with the present invention will now be described with reference to FIG. 1 for the case in which mirror-surface wafers are produced from an ingot of semiconductor monocrystalline silicon manufactured by the Czochralski method.

As in the conventional method, this process involves carrying out a slicing process (1) in which a monocrystalline ingot which has been produced with monocrystalline production apparatus is sliced to obtain thin disk-shaped wafers; a chamfering process (2) in which the outer edge is chamfered in order to prevent the generation of cracks and defects in the wafers obtained in the slicing process (1); a lapping process (3) in which the chamfered wafers are lapped and flattened; and an etching process (4) in which working damage remaining in the chamfered and lapped wafer surface is removed. Thus, the process up to this stage is unchanged in principle from the conventional process for the manufacture of semiconductor silicon monocrystalline mirror-surface wafers.

The distinguishing feature of the invention is the subsequent processing, and the donor-annihilation heat treatment which would normally be carried out next, or which should have been carried out already, is omitted here. Hence, immediately after the etching process (4), there is carried out a mirror-surface polishing process (5), including a primary mirror-surface polishing process, and if necessary a secondary mirror-surface polishing process, in which the surface of the etched wafer is subjected to coarse polishing.

Subsequently, the finishing mirror-surface polishing process, in which the surface of the wafer which has been subjected to the aforementioned coarse mirror-surface polishing is further polished and which according to the conventional process should be carried out next, is omitted here. In its place, a cleaning process (6) is carried out to clean the coarse mirror-surface polished wafer, thereby removing polishing material and foreign matter attached to the wafer. Subsequently, a PACE process (7) is carried out in which the wafer is given a high degree of flatness.

A heat treatment process (8) is then carried out to eliminate the damage and defects of the wafer surface produced by the PACE process. The heat treatment also serves as a donor-annihilation heat treatment.

After the heat treatment process, there is carried out a finishing mirror-surface polishing process (9) which removes the ripple and haze—especially the haze which has been generated by the PACE process—from the wafer surface and at the same time also removes the surface oxide film which has been produced by the heat treatment. Finally, a final wafer cleaning process (10) is carried out.

EXAMPLES

Mirror-surface wafers having a diameter of 200 mm were produced from an ingot of semiconductor silicon monocrystal manufactured in accordance with the Czochralski method, and the improvement in wafer quality provided by the present invention was evaluated through comparison with the conventional process. The results obtained are shown in FIGS. 2 to 4.

Figure 2:
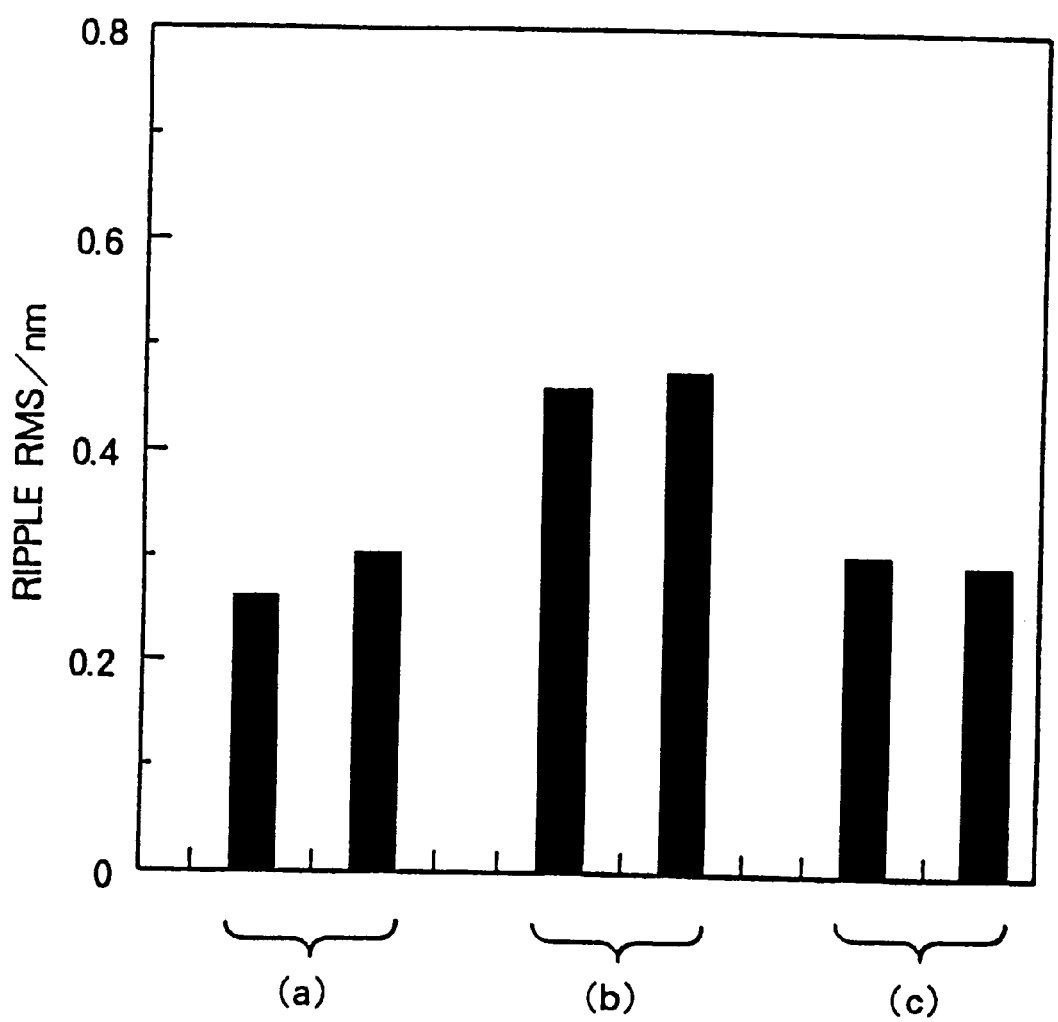
FIG. 2 is a drawing which shows a comparison of ripple components between the present invention and the conventional process.
Figure 3:
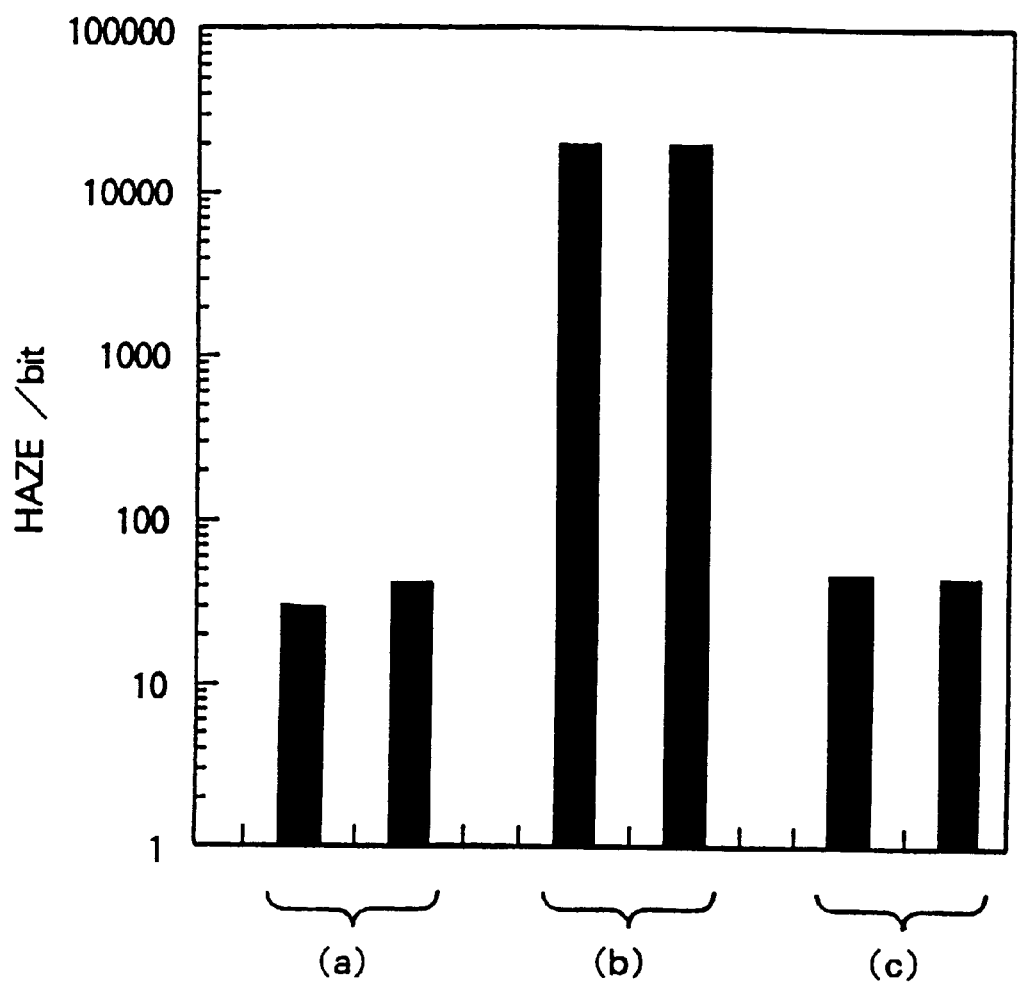
FIG. 3 is a drawing which shows a comparison of haze components between the present invention and the conventional process.

A comparison of the ripple components is shown in FIG. 2, a comparison of the haze components is shown in FIG. 3, and the effects of absence or presence of a heat treatment and heat treatment temperature are shown in FIG. 4.

Figure 6:
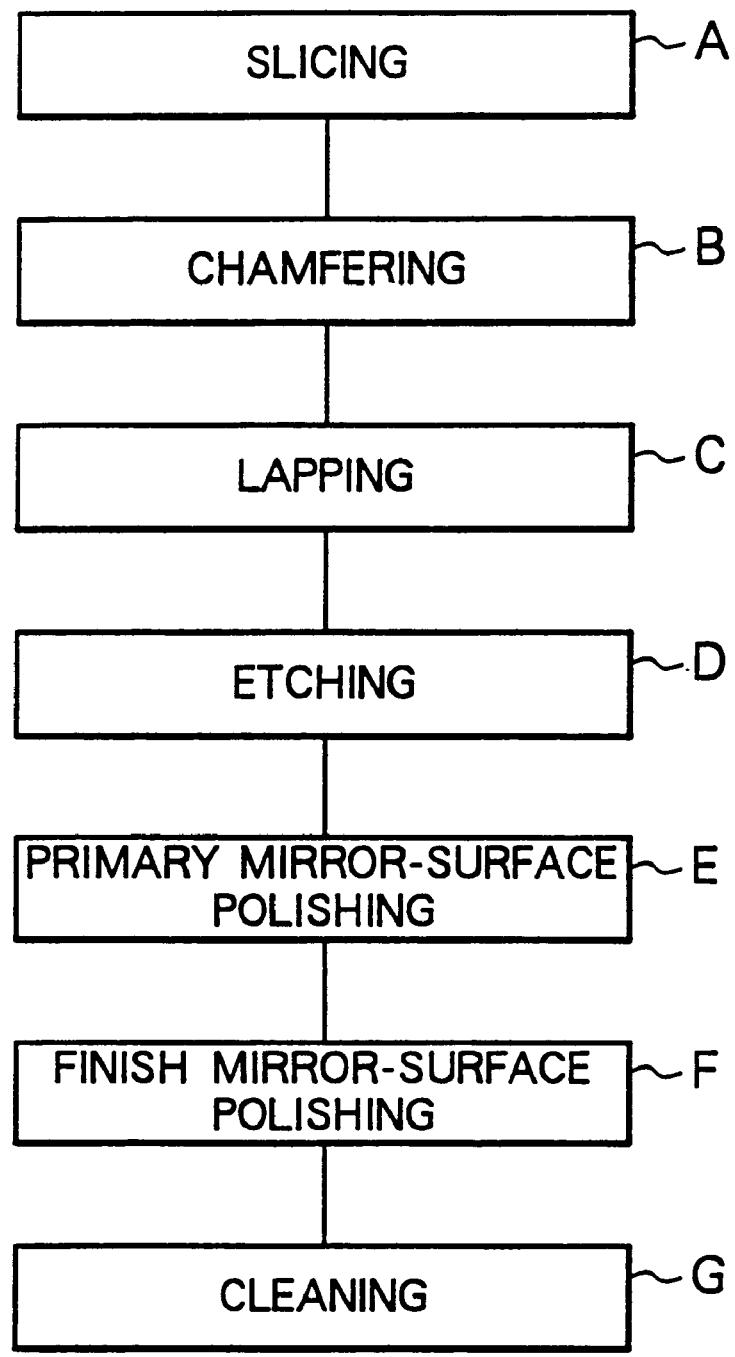
FIG. 6 is a flow chart of a conventional silicon mirror-surface wafer manufacturing process.

Furthermore, in FIGS. 2–4, (a) indicates a wafer obtained with the conventional semiconductor monocrystalline mirror-surface wafer production process shown in FIG. 6, (b) indicates a wafer immediately subsequent to the PACE process in the semiconductor monocrystalline mirror-surface wafer production process of the present invention shown in FIG. 1, and (c) indicates a wafer of the present invention which has been subjected to all of the processes of the invention shown in FIG. 1.

The ripple component was measured as follows:

An optical apparatus (WYKO Topo-3D: manufactured by WYKO) for measuring surface shape using the Mirau Interferometer was used to measure the surface roughness of the region of 250 $\mu$m×250 $\mu$m. The RMS (root mean square) roughness calculated from the measurements was used as a scale showing the level of ripple.

The haze component was measured by using a light scattering particle counter (LS-6000: HITACHI ELECTRONICS ENGINEERING CO.LTD) in a mode for measuring haze.

The lifetime was measured as follows:

The surface of a wafer to be measured was subjected to chemical passivation and the lifetime of the thus-processing surface was measured by an apparatus (LIFE-TECH-88R: manufactured by Semitex) for measuring a lifetime using a microwave.

As is clear from FIG. 2, as with a conventional wafer, a good value in terms of the ripple component of the surface roughness was obtained with a wafer of the present invention, because the ripple of the wafer immediately after the PACE process was removed by the finishing polishing.

Next, as is clear from FIG. 3, as with a conventional wafer, a good value in terms of the haze component of the surface roughness was obtained with a wafer of the present invention, because the haze component of the wafer immediately subsequent to the PACE process was removed by the finishing polishing.

Furthermore, as can be understood from FIG. 4, since the wafer immediately after the PACE process had more surface damage than did a conventional wafer, the wafer lifetime deteriorated markedly. However, the wafer lifetime was recovered by use of a heat treatment. Also, it was found that a temperature of at least 400° C., generally at least 500° C., is desirable for the treatment temperature, that a temperature below 800° C. is adequate, and that even if the temperature exceeds this level no further effect can be expected.

Figure 5A:
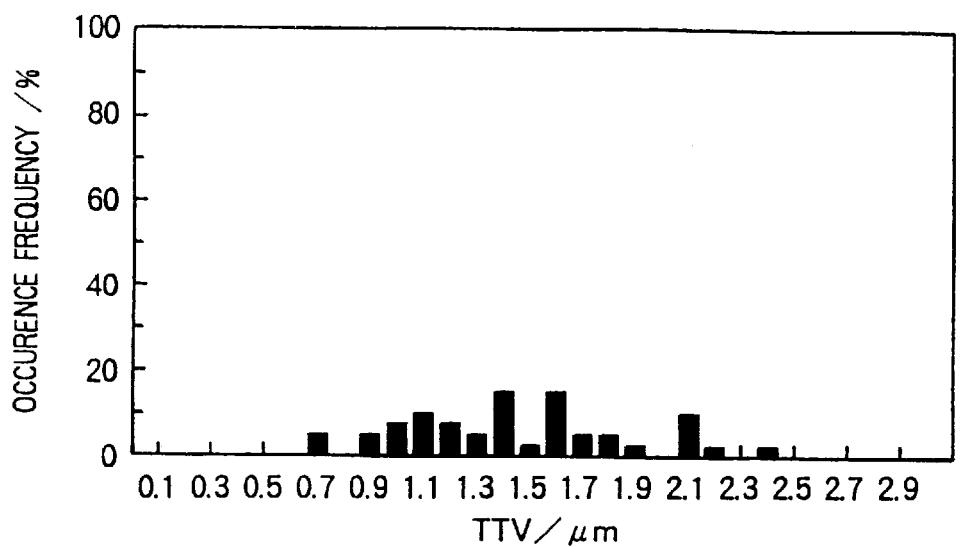
Figure 5B:
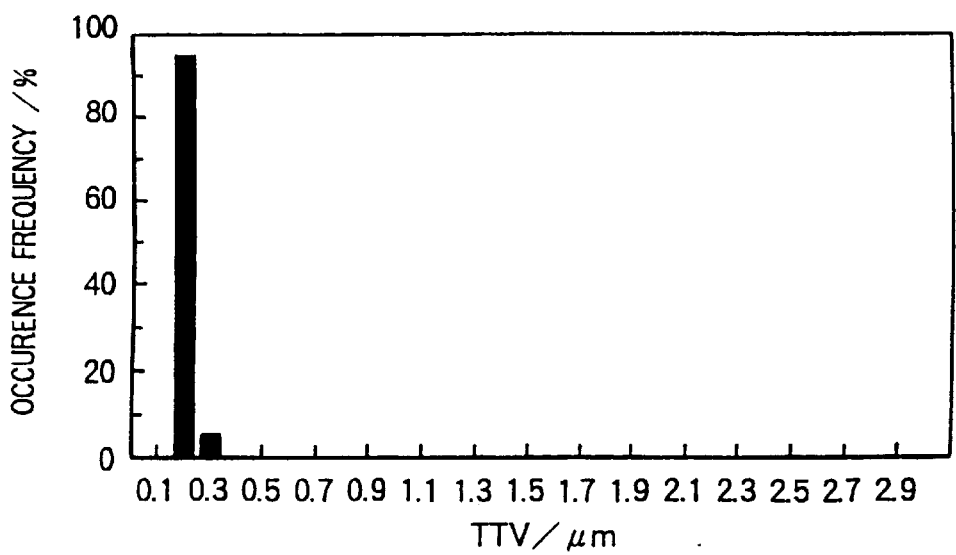

On the other hand, a wafer of the present invention in which the ripple, haze and surface damage (lifetime) had been improved in the above-described manner had the same degree of flatness as that shown in FIG. 5B, and the high degree of flatness provided by the PACE process was retained.

In the above-described embodiment, wafers to be flattened are semiconductor silicon wafers. However, the invention is not limited thereto, and the present invention can be applied to wafers of other semiconductor materials, such as germanium, or compound semiconductor single crystals such as GaAs, GaP and InP.

Furthermore, in the above-described embodiment, the manufacture of silicon semiconductor monocrystalline mirror-surface wafers having a diameter of 200 mm has been described. However, the invention is not limited thereto and can be applied to the manufacture of wafers with a high degree of flatness obtained by subjecting to the PACE process large diameter silicon wafers having a diameter of 300 mm or more or 400 mm or more. In these cases as well, the same action and effects can be obtained. Of course, the present invention can also, conversely, be applied to wafers having a diameter of 150 mm or less.

Furthermore, although in the above-described embodiment, the PACE process is used as an example of gas phase etching, the present invention is not limited thereto and can be applied to cases where a wafer is made flat by gas phase etching in which high intensity light or an ultraviolet laser, for example, is used as an excitation source. In these cases as well, the same action and effects can be obtained.

What is claimed is:

1. A method of manufacturing a semiconductor monocrystalline mirror-surface wafer comprising the steps of:

slicing a semiconductor monocrystalline ingot so as to obtain a thin disk-shaped wafer;

chamfering the peripheral edge of the wafer obtained in the slicing step;

lapping the chamfered wafer so as to make the surface of the chamfered wafer flat;

performing etching so as to remove working damage remaining in the chamfered and lapped wafer surface;

subjecting the surface of the etched wafer to mirror-surface polishing;

subjecting the surface of the mirror-surface polished wafer to gas phase etching so as to flatten the surface of the wafer to a high degree; and cleaning the wafer which has been mirror-surface polished and flattened to a high degree, wherein said mirror-surface polishing step is composed of coarse polishing and finishing polishing, and only the coarse polishing is performed prior to said gas phase etching step, while the finishing polishing is carried out after the gas phase etching step.

2. A method of manufacturing a semiconductor monocrystalline mirror-surface wafer according to claim 1, wherein the coarse polishing in said mirror-surface polishing step preceding said gas phase etching step is carried out in such a way that the RMS value of the ripple component of a roughness becomes equal to or less than 0.5 nm.

3. A method of manufacturing a semiconductor monocrystalline mirror-surface wafer according to claim 1, wherein a heat treatment process is carried out after said gas phase etching step and before said cleaning step.

4. A method of manufacturing a semiconductor monocrystalline mirror-surface wafer according to claim 2, wherein a heat treatment process is carried out after said gas phase etching step and before said cleaning step.

5. A method of manufacturing a semiconductor monocrystalline mirror-surface wafer according to claim 3, wherein said heat treatment process is carried out before the finishing polishing.

6. A method of manufacturing a semiconductor monocrystalline mirror-surface wafer according to claim 3, wherein said heat treatment step is carried out for 20 minutes to 2 hours at a temperature in the range of 400–800° C.

7. A method of manufacturing a semiconductor monocrystalline mirror-surface wafer according to claim 4, wherein said heat treatment step is carried out for 20 minutes to 2 hours at a temperature in the range of 400–800° C.

8. A method of manufacturing a semiconductor monocrystalline mirror-surface wafer according to claim 3, wherein said heat treatment is a donor-annihilation heat treatment.

9. A method of manufacturing a semiconductor monocrystalline mirror-surface wafer according to claim 1, wherein said semiconductor monocrystal is a silicon monocrystal.

10. A method of manufacturing a semiconductor monocrystalline mirror-surface wafers according to claim 1, wherein said gas phase etching is plasma assisted chemical etching.

* * * * *